US007656088B2

(12) United States Patent
Lee et al.

(10) Patent No.: US 7,656,088 B2
(45) Date of Patent: Feb. 2, 2010

(54) ORGANIC ELECTROLUMINESCENCE DEVICE AND METHOD FOR FABRICATING THE SAME

(75) Inventors: Kyung Hoon Lee, Seoul (KR); Woo Chan Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 229 days.

(21) Appl. No.: 11/963,396

(22) Filed: Dec. 21, 2007

(65) Prior Publication Data

US 2009/0115317 A1     May 7, 2009

(30) Foreign Application Priority Data

Nov. 7, 2007   (KR) .................. 10-2007-0113091

(51) Int. Cl.
*H01J 1/62*      (2006.01)
*H01J 63/04*     (2006.01)

(52) U.S. Cl. .................. 313/512; 313/498; 313/504; 313/506

(58) Field of Classification Search .......... 313/498–512
See application file for complete search history.

(56) References Cited

U.S. PATENT DOCUMENTS

| 2003/0067268 | A1* | 4/2003 | Matsuoka | 313/512 |
| 2004/0178727 | A1* | 9/2004 | Song et al. | 313/512 |
| 2005/0046344 | A1* | 3/2005 | Lee et al. | 313/504 |
| 2006/0007963 | A1  | 1/2006 | Kang et al. | |
| 2006/0076886 | A1* | 4/2006 | Ahn | 313/512 |
| 2006/0087229 | A1* | 4/2006 | Kim | 313/509 |
| 2006/0216457 | A1* | 9/2006 | Takahashi et al. | 428/76 |
| 2007/0029928 | A1* | 2/2007 | Choi et al. | 313/504 |
| 2007/0257612 | A1* | 11/2007 | Ko et al. | 313/512 |
| 2008/0036372 | A1* | 2/2008 | Lee | 313/504 |
| 2008/0093990 | A1* | 4/2008 | Lim et al. | 313/512 |

FOREIGN PATENT DOCUMENTS

| JP | 2007-14174 | 6/2007 |
| KR | 2003-0035647 | 5/2003 |

OTHER PUBLICATIONS

Korean Office Action dated Dec. 3, 2008 (Korean text).

* cited by examiner

*Primary Examiner*—Karabi Guharay
*Assistant Examiner*—Kevin Quarterman
(74) *Attorney, Agent, or Firm*—KED & Associates, LLP

(57) ABSTRACT

An organic electroluminescent (EL) device is provided that may include a first electrode, an organic layer and a second electrode arranged in a light-emitting region of a substrate. The device may also include a cap for sealing the light-emitting region of the substrate. The cap may have a caved surface with a minimum depth of 10 μm and a maximum depth of 10% of a total thickness of the cap.

16 Claims, 5 Drawing Sheets

ORGANIC ELECTROLUMINESCENCE DEVICE AND METHOD FOR FABRICATING THE SAME

The present application claims priority from Korean Patent Application No. 10-2007-0113091, filed Nov. 7, 2007, the subject matter of which is incorporated herein by reference.

BACKGROUND

1. Field

Embodiments of the present invention may relate to an organic electroluminescent (EL) device (hereafter an organic EL device).

2. Background

Organic electroluminescent (EL) devices may use a principle that when charge carriers are injected into an organic film formed between an electron injecting electrode (cathode) and a hole injecting electrode (anode), electrons may combine with holes to create electron-hole pairs, which may then decay to emit light.

Organic EL devices may be fabricated on flexible transparent substrates (e.g., plastic substrates) and may operate at a voltage (e.g., 10V or below) lower than voltages required to operate plasma display panels (PDPs) and inorganic electroluminescent devices. Organic EL devices may have relatively low power consumption and excellent color representation. Organic EL devices may emit light of three colors (i.e., green, blue and red). Organic EL devices may be considered as next-generation full-color display devices.

However, organic EL devices may readily deteriorate due to moisture and oxygen, thus disadvantageously reducing a lifespan of the device. Organic EL devices may be capped with a transparent cap and may be sealed to prevent permeation of external moisture and oxygen.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1A:
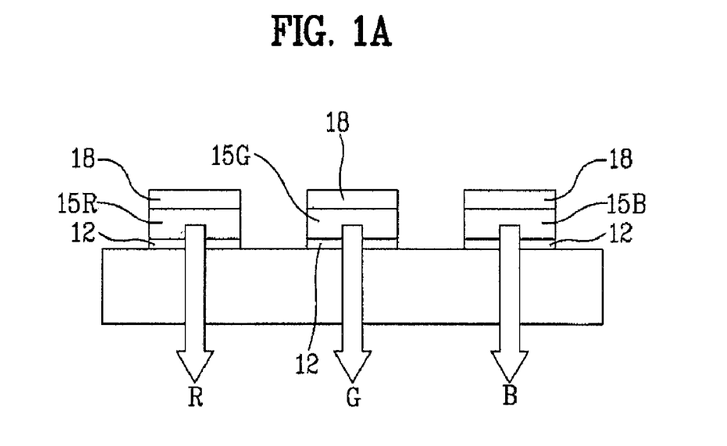
FIGS. 1A to 1C illustrate various implementations of a color image display method in an organic light emitting device.
Figure 1B:
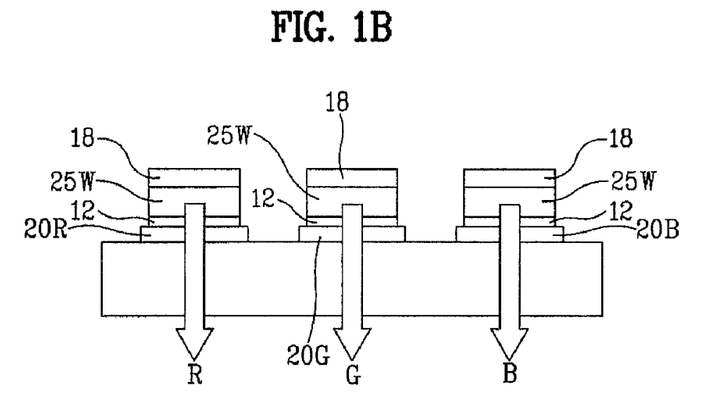
Figure 1C:
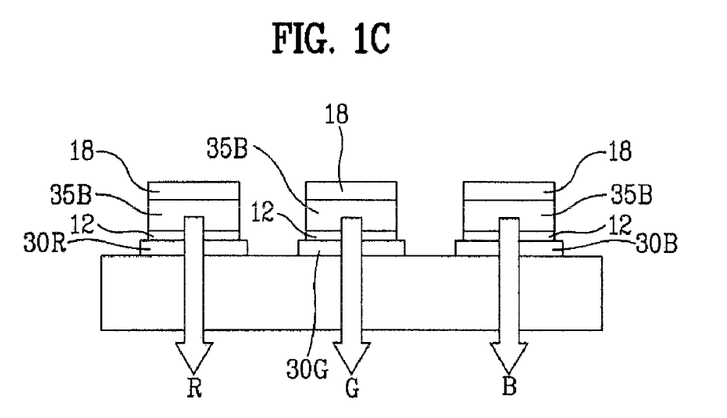

FIGS. 1A to 1C illustrate various implementations of a color image display method in an organic light emitting device. Other implementations may also be used. FIG. 1A illustrates a color image display method in an organic light emitting device that separately includes a red organic emitting layer 15R to emit red light, a green organic emitting layer 15G to emit green light and a blue organic emitting layer 15B to emit blue light. The red, green and blue light produced by the red, green and blue organic emitting layers 15R, 15G and 15B may be mixed to display a color image.

In FIG. 1A, the red, green and blue organic emitting layers 15R, 15G and 15B may each include an electron transporting layer, an emitting layer, a hole transporting layer, and the like. FIG. 1A also shows a substrate 10, an anode electrode 12 and a cathode electrode 18. Different dispositions and configurations of the substrate 10, the anode electrode 12 and the cathode electrode 18 may also be used.

FIG. 1B illustrates a color image display method in an organic light emitting device that includes a white organic emitting layer 25W to emit white light, a red color filter 20R, a green color filter 20G and a blue color filter 20B.

As shown in FIG. 1B, the red color filter 20R, the green color filter 20G and the blue color filter 20B each receive white light produced by the white organic emitting layer 25W and produce red light, green light and blue light, respectively. The red, green and blue light may be mixed to display a color image. In FIG. 1B, the white organic emitting layer 25W may include an electron transporting layer, an emitting layer, a hole transporting layer, and the like.

FIG. 1C illustrates a color image display method in an organic light emitting device that includes a blue organic emitting layer 35B to emit blue light, a red color change medium 30R, a green color change medium 30G and a blue color change medium 30B.

As shown in FIG. 1C, the red color change medium 30R, the green color change medium 30G and a blue color change medium 30B each receive blue light produced by the blue organic emitting layer 35B and produce red light, green light and blue light, respectively. The red, green and blue light may be mixed to display a color image. In FIG. 1C, the blue organic emitting layer 35B may include an electron transporting layer, an emitting layer, a hole transporting layer, and the like.

Figure 2:
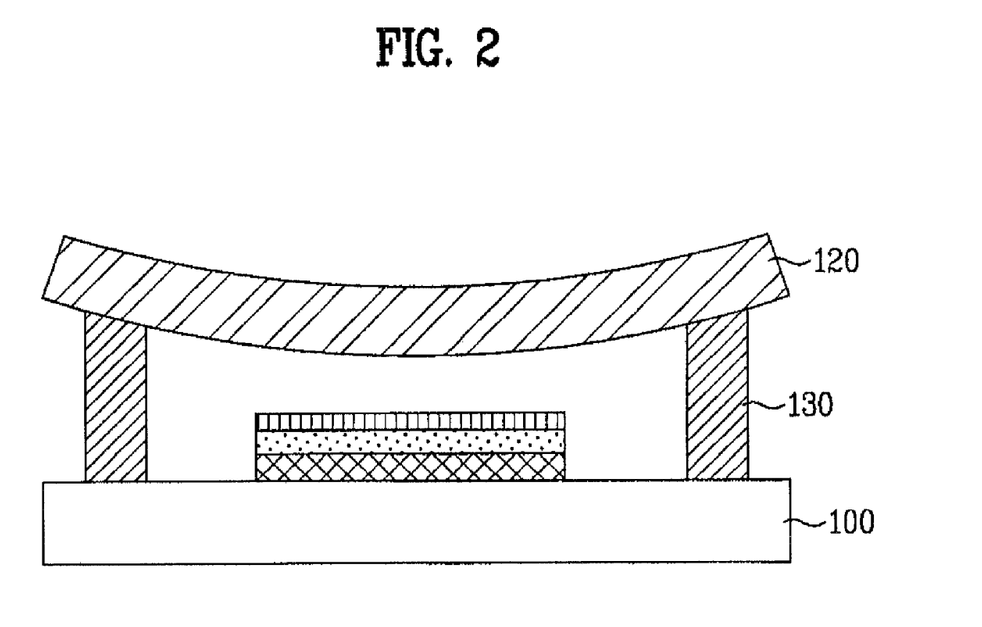
FIG. 2 is a cross-sectional view illustrating an organic EL device according to an example arrangement.

FIG. 2 is a cross-sectional view illustrating a transparent cap of an organic EL device according to an example arrangement. Other arrangements may also be used. As shown in FIG. 2, a light-emitting region of a substrate 100, where an anode, an organic layer and a cathode are formed, may be capped with a transparent cap 120. The light emitting region may then be sealed to prevent permeation of external moisture and oxygen.

The edge region of the transparent cap 120 may be sealed at a non-light emitting region of the substrate 100 using a sealing material 130 (e.g., a sealant). A center region of the transparent cap 120 and the light-emitting region of the substrate 100 may be spaced apart from each other by a predetermined distance.

The edge region of the transparent cap 120 may be supported by the sealing material 130. However, the center region of the transparent cap 120 may have no direct support and may sink or bend down (i.e., toward the substrate 100) under weight of the transparent cap 120. As a result, the transparent cap 120 may become bent or curved.

The bending of the transparent cap 120 may cause Newton's rings. Newton's rings are a phenomenon in which when incident light is reflected by the substrate 100 and the transparent cap 120, concentric circle patterns may be formed on the surface of the transparent cap 120 due to a light passage difference. This may result in deterioration of a contrast ratio of the organic EL device.

Figure 3:
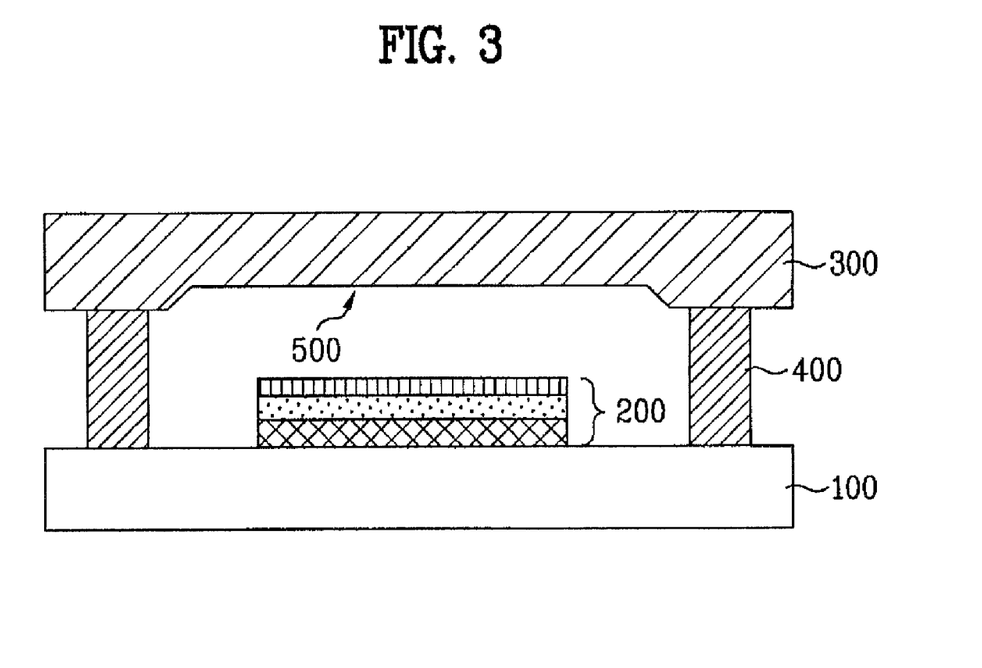
FIG. 3 is a cross-sectional view illustrating an organic EL device according to an example embodiment of the present invention.
Figure 4:
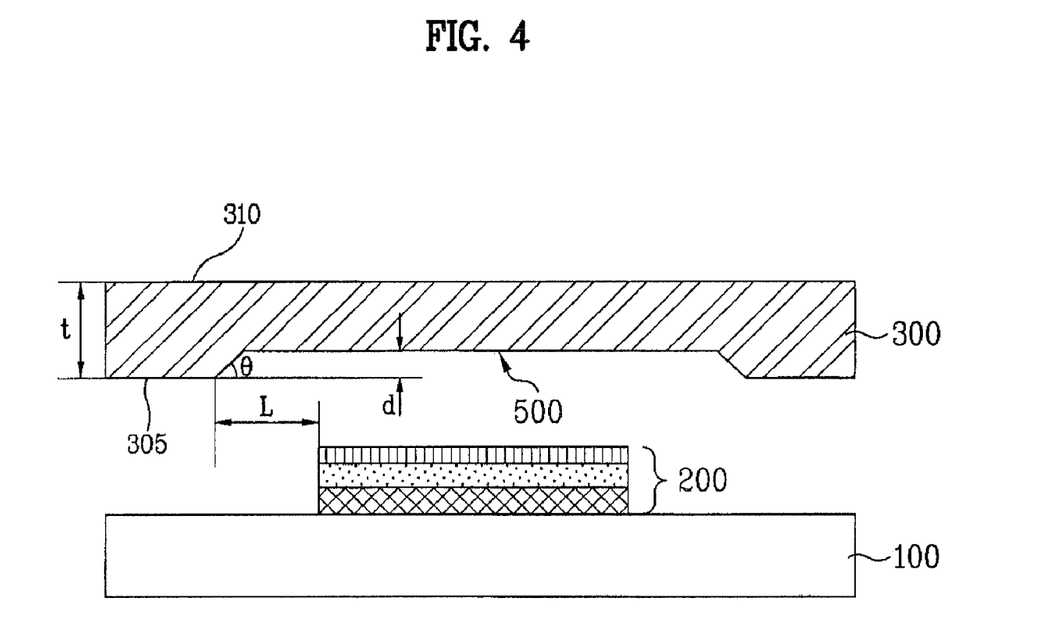
FIG. 4 is a detailed view illustrating the cap shown in FIG. 3.

FIG. 3 is a cross-sectional view illustrating an organic EL device according to an example embodiment of the present invention. FIG. 4 is a detailed view of the cap shown in FIG. 3. Other embodiments and configurations are also within the scope of the present invention.

As shown in FIG. 3, the organic EL device may include the substrate 100 having a light-emitting region and a non-light emitting region, an organic electroluminescent (EL) array 200 and a cap 300 for sealing the organic EL array 200. The light-emitting region may be defined based on the organic EL array 200. For example, the light-emitting region may be between boundary lines that represent sides of the organic EL array 200.

The substrate 100 may be an insulating glass, plastic and/or conductive substrate.

The organic EL array 200 may include a first electrode, an organic layer and a second electrode. The first electrode may be made of indium tin oxide (ITO) or indium zinc oxide (IZO). If the first electrode is designed for top emission, then the first electrode may further include a reflective film. The organic layer may include at least one light-emitting layer and further include a hole injection layer, a hole transfer layer and/or an electron injection layer. The second electrode may include at least one low-work function metal selected from Mg, Ag, Al, Ca and/or an alloy thereof.

The organic EL array 200 may further include a thin film transistor that includes a semiconductor layer, a gate electrode, a source/drain electrode and the like.

The thin film transistor may have a top gate structure in which the gate electrode is arranged on the semiconductor layer, or a bottom gate structure in which the gate electrode is arranged under the semiconductor layer.

The organic EL device may further include a passivation layer to cover the organic EL array 200. The passivation film may protect the organic EL array 200 against external physical impacts and chemical actions. The passivation film may be composed of an organic film, an inorganic film and/or a combination thereof.

As shown in FIG. 4, the cap 300 may have a bottom surface 305 that faces the substrate 100, a top surface 310 that faces away from the substrate, and a caved surface 500. The bottom surface 305 may be at an area of the cap 300 outside of the caved surface 500. The caved surface 500 may have a depth (or distance) d in a center area thereof. The depth d may be referred to as the depth of the caved surface 500. The depth d may be defined as a distance in a first direction from a top point of the caved surface 500 to a plane defined by the bottom surface 305 (and extending along a second direction). The top point may be a farthest point on the caved surface 500 from the substrate 100 or the organic EL array 200.

The caved surface 500 may have a minimum depth d of approximately 10 μm and a maximum depth d of approximately 10% of a total thickness t of the cap 300. The total thickness t may be a distance in the first direction between the top surface 310 and the bottom surface 305 of the cap 300.

When the depth d of the caved surface 500 is less than 10 μm, then Newton's rings may occur. Additionally, when the depth d of the caved surface 500 is greater than 10% of the total thickness t of the cap 300, then the cap 300 may break due to external physical impacts.

A total area of the caved surface 500 in the cap 300 may be larger than a total area of the light-emitting region in the substrate 100. Stated differently, a total surface area of the caved surface 500 may be larger than a total surface area of the light emitting region facing the caved surface 500.

A first boundary point may define one edge (i.e., an outer edge) of the caved surface 500 where the first surface 305 meets the caved surface 500. A second boundary point may define another edge (i.e., another outer edge) of the caved surface 500 where the first surface 305 meets the caved surface 500. A first boundary line may also define an edge of the light emitting region (and/or the organic EL array 200) and a second boundary line may define another edge of the light emitting region (and/or the organic EL array 200). The first boundary point of the caved surface 500 and the first boundary line of the light emitting region may be separated by a distance L in the second direction. The distance L between the first boundary point of the caved surface 500 and the first boundary line of the light-emitting region may be at least 70 μm. When the distance L is less than 70 μm, light may scatter on the boundaries of the caved surface 500 and be lost. As a result, luminescent efficiency may be decreased.

The caved surface 500 may extend into the cap 300 from the first boundary point to a depth that is at least 10 μm and no more than 10% of a total thickness of the cap 300.

FIG. 4 also shows an angle Θ between the bottom surface 305 of the cap 300 and an inclined surface (or inclined plane) of the caved surface 500 at the first boundary point. The angle Θ may be 60° or less. When the angle θ is larger than 60°, there may be a danger that the cap 300 may be broken by external physical stimulus.

As the angle θ decreases, a natural frequency of the cap 300 may increase, and a stress concentration and variation thereof may decrease. Natural frequency may be directly proportional to modulus of elasticity and inertial moment. However, natural frequency may be inversely proportional to weight.

When the structure of the cap 300 is modified, the modulus of elasticity may be constant, and inertial moment and weight may be varied. However, the variation of the inertial moment may be larger than the variation of weight and have a greatest effect on the variation of natural frequency.

The inertial moment may be varied as the angle θ decreases. As a result, the natural frequency may increase. This increase in natural frequency may induce reinforcement in stiffness of the cap 300.

The correlation between factors indicate that when there is no increase or a slight increase in weight, then a variation in a cross-sectional shape may enable an increase in natural frequency, thus resulting in improvement in stiffness.

As the angle θ decreases, a stress concentration of impacts applied to the cap 300 may be reduced. This may make the impacts uniformly distributed on an entire surface of the cap 300 and cause a decrease in variation of the cap 300.

Accordingly, the angle θ may be 60° or less, thus causing an increase in a nature frequency of the cap 300, an improvement in an absorptive force of external impacts, a decrease in stress concentration and/or a reduction in variation of the cap 300, thereby reinforcing overall stiffness.

The caved surface 500 may be formed in a center area of the cap 300 (or in another area) such that the cap 300 at the caved surface 500 has a refractive index of approximately 1.6 to 2. More specifically, when the caved surface 500 of the cap 300 is formed, a refractive index of the cap 300 at the caved surface 500 may be taken into consideration. That is, the caved surface 500 of the cap 300 may be formed such that the refractive index is within a range of approximately 1.6 to 2.

When the cap 300 has a refractive index higher than glass (i.e., about 1.5), then the refractive index may inhibit loss of light and improve luminescent efficiency, thereby enabling a reduction in consumption power. Thus, the caved surface 500 of the cap 300 may be formed such that the cap 300 at the caved surface 500 has a refractive index of approximately 1.6 to 2.

The minimum depth d of the caved surface 500 may be approximately 10 μm or more. A maximum depth of the caved surface 500 may be approximately 10% or less than the total thickness t of the cap 300.

The cap 300 may be composed of transparent materials including $TiO_2$, $BaO$ and $B_2O_3$. The composition ratio (mole/ mole/mole %) of $TiO_2:BaO:B_2O_3$ may be approximately 10% to 60%:approximately 10% to 40%:approximately 5% to 30%.

The cap 300 may be composed of at least one selected from poly(ethylene terephthalate) (PET), poly(ethylenenaphthalate) (PEN), poly(carbonate) (PC), poly(ethersulfone) (PES), polyarylate (PAR), polysulfone (PSF), cyclic-olefin copolymer (COC), polyimide (PI), a PI-fluoro-based polymeric compound, polyetherimide (PEI), an epoxy resin, a liquid crystalline polymer (LCP), a metal foil, thin glass and a thin wafer. The cap 300 may be composed of at least one of an organic filler, an inorganic filler, a glass fiber and/or a polymeric medium of silica particles.

FIG. 3 also shows a sealing material 400 formed on the edge of the cap 300 and the substrate 100 to adhere the cap 300 to the substrate 100. The sealing material 400 may be a UV curable material, a thermally curable material and/or glass frit.

The glass frit for the sealing material 400 may be composed of at least one of potassium oxide ($K_2O$), antimony trioxide ($Sb_2O_3$), zinc oxide (ZnO), titanium dioxide ($TiO_2$), aluminum trioxide ($Al_2O_3$), tungsten trioxide ($WO_3$), tin oxide (SnO), lead oxide (PbO), vanadium pentoxide ($V_2O_5$), ferric oxide ($Fe_2O_3$), phosphorus pentoxide ($P_2O_5$), boron oxide ($B_2O_3$) and/or silicon dioxide ($SiO_2$).

The caved surface 500 of the cap 300 may be arranged such that the caved surface 500 faces the organic EL array 200 on the substrate 100, and such that the substrate 100 and the cap 300 may be sealed with the sealing material 400 arranged on edges of the cap 300 and/or the substrate 100.

Figure 5:
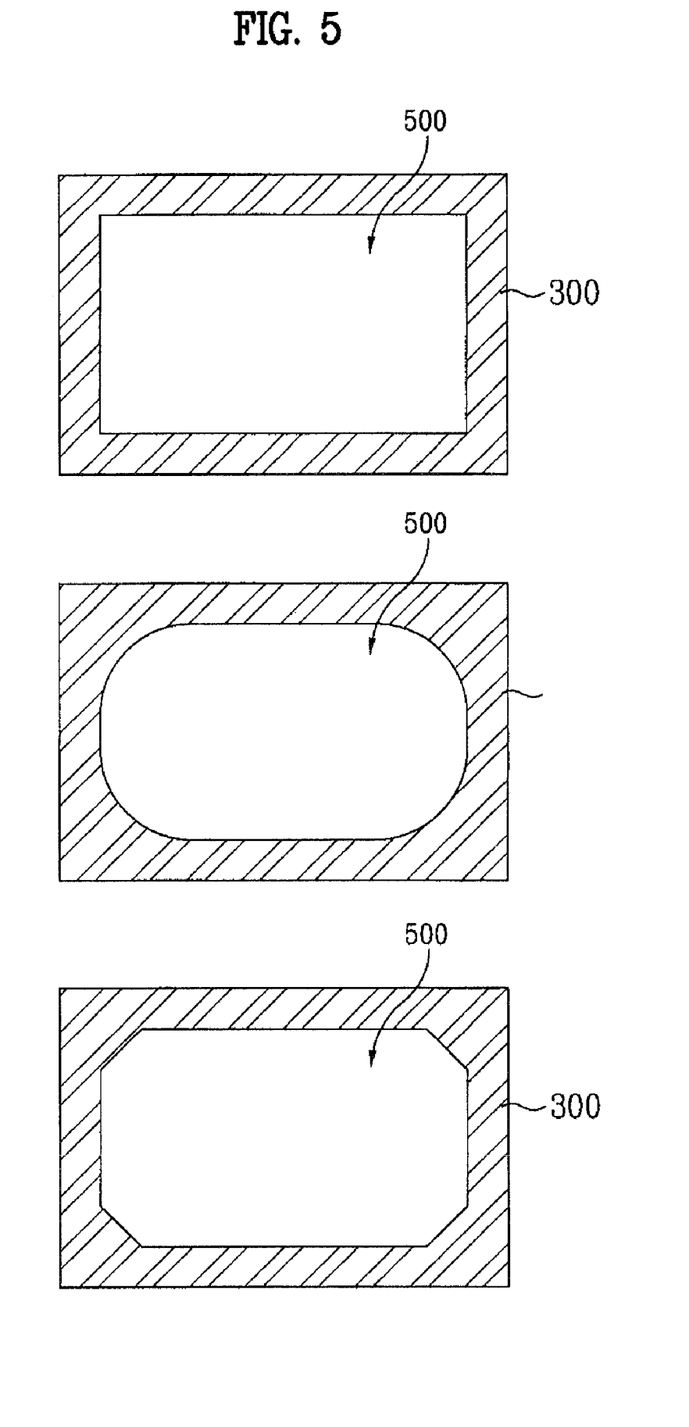
FIG. 5 is a plane view illustrating shapes of the cap of FIG. 3.

FIG. 5 is a plane view illustrating shapes of the cap of FIG. 3. The shape of the caved surface 500 of the cap 300 may be equivalent to the shape of the organic EL array 200. However, as shown in FIG. 5, the caved surface 500 may have a square shape, an elliptical shape, a circular shape and/or a polygonal shape.

The caved surface 500 may be formed by taking into consideration a level that light is scattered on the circumstance thereof and an arrangement of the organic EL array 200 on the substrate 100.

Figure 6A:
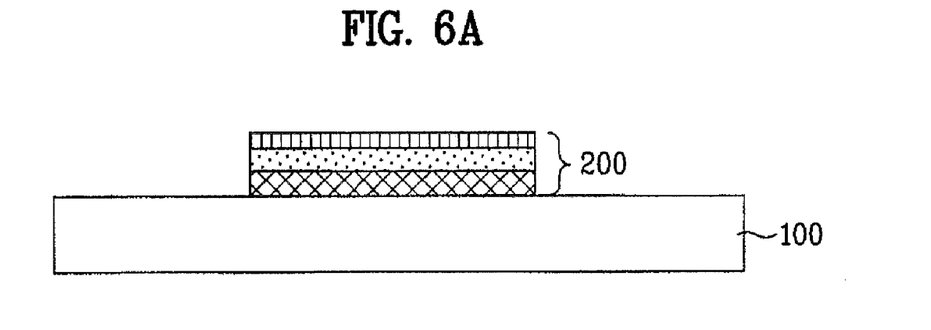
FIGS. 6A to 6C are cross-sectional views illustrating a process for fabricating an organic EL device according to an example embodiment of the present invention.
Figure 6B:
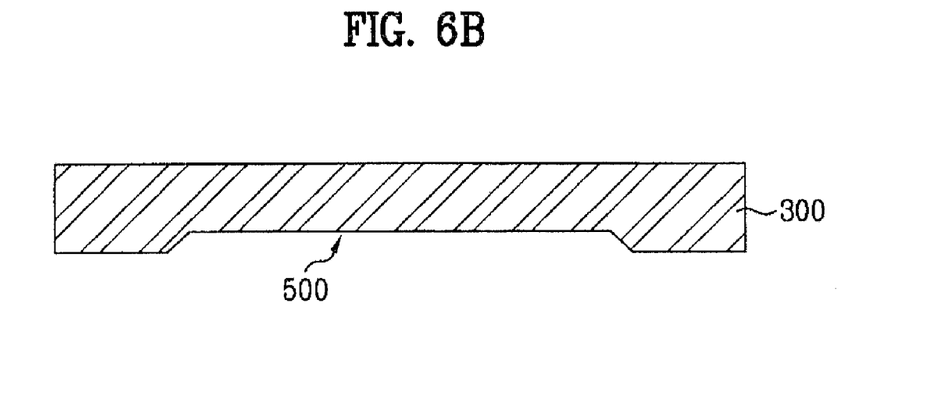
Figure 6C:
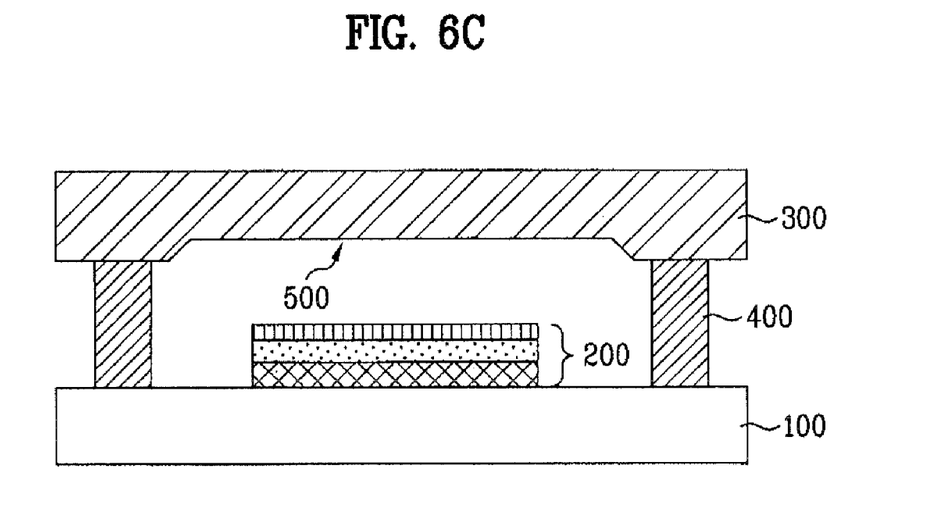

FIGS. 6A to 6C are cross-sectional views illustrating a process for fabricating an organic EL device according to an example embodiment of the present invention. Other embodiments, configurations and processes are also within the scope of the present invention.

As shown in FIG. 6A, the organic EL array 200 may provide a light-emitting region of the substrate 100. The light-emitting region may be provided between boundary lines defined by sides of the organic EL array 200. The organic EL array 200 may include a first electrode, an organic layer and a second electrode. As shown in FIG. 6B, the cap 300 may be prepared to seal the light-emitting region of the substrate 100. The organic EL array 200 may include a plurality of subpixels. Stated differently, the organic EL device may include a light emitting region that includes a plurality of subpixels.

The caved surface 500 of the cap 300 may be formed in the center area of the cap 300 such that the caved surface 500 has a minimum depth of 10 μm and a maximum depth of 10% of the total thickness of the cap 300.

The formation of the caved surface 500 may be carried out by various techniques such as etching, sand blasting and/or molding. Other techniques may also be used.

The minimum distance between the first boundary point of the caved surface 500 in the cap 300 and the first boundary line of the light-emitting region may be equivalent to or greater than 70 μm. The angle θ between the bottom surface 305 of the cap 300 and the inclined surface (or plane) of the caved surface 500 may be 60° or less.

The total surface area of the caved surface 500 of the cap 300 may be larger than the total surface area of the light-emitting region of the substrate 100. The caved surface 500 may have the depth d to allow the refractive index to be within a range of approximately 1.6 to 2.

The caved surface 500 may be formed by taking into consideration a level that light is scattered on a circumstance thereof and an arrangement of the organic EL array 200 on the substrate 100.

As shown in FIG. 6C, the sealing material 400 may be formed on the edge area of the cap 300 (such as outside the center area of the cap 300) and/or the substrate 100. The sealing material 400 may be formed by various methods such as screen printing and dispensing.

The cap 300 may be arranged on the substrate 100 using the sealing material 400 such that the caved surface 500 of the cap 300 faces the light-emitting region of the substrate 100. The sealing material 400 may be cured by thermal or laser irradiation to adhere the cap 300 to the substrate 100.

Embodiments of the present invention may provide an organic EL device and fabrication method thereof that provided a caved surface to be formed in the center area of a cap such that the caved surface has a minimum depth of 10 um from the surface of the cap, and a maximum depth of 10% of the total thickness of the cap. This may prevent or minimize Newton's rings from being formed due to an improved contrast ratio and a reduction of external physical impacts.

By forming the caved surface of the cap to have a refractive index in a range of 1.6 to 2, inhibition of light loss may be realized, luminescent efficiency may be improved and consumption power may be reduced.

The organic EL array 200 discussed above may include a plurality of unit pixels with each unit pixel including a plurality of subpixels. For example, FIGS. 1A-1C show different arrangements of red, blue, green and white light emitting layers to produce various combinations of red, blue and green light. Other combinations and/or colors may be used. The light emitting layers of the subpixels may include phosphorescence material and/or fluorescence material. The arrangements of FIGS. 1A-1C may be provided within any of the embodiments of the present invention and/or displays associated with each of FIGS. 2-6C.

In a case where the subpixel emits red light, the emitting layer of the subpixel may include a host material including carbazole biphenyl (CBP) or 1,3-bis(carbazol-9-yl (mCP), and may be formed of a phosphorescence material including a dopant material including PIQIr(acac)(bis(1-phenylisoquinoline)acetylacetonate iridium), PQIr(acac) (bis(1-phenylquinoline)acetylacetonate iridium), PQIr(tris(1-phenylquinoline)iridium), or PtOEP(octaethylporphyrin platinum) or a fluorescence material including PBD:Eu (DBM)3(Phen) or Perylene.

In the case where the subpixel emits green light, the emitting layer may include a host material including CBP or mCP, and may be formed of a phosphorescence material including a dopant material including Ir(ppy)3(fac tris(2-phenylpyridine)iridium) or a fluorescence material including Alq3 (tris (8-hydroxyquinolino)aluminum).

In the case where the subpixel emits blue light, the emitting layer may includes a host material including CBP or mCP, and may be formed of a phosphorescence material including a dopant material including (4,6-F2 ppy)2Irpic or a fluorescence material including spiro-DPVBi, spiro-6P, distyryl-benzene (DSB), distyryl-arylene (DSA), PFO-based polymers, PPV-based polymers, or a combination thereof.

Embodiments of the present invention may provide an organic electroluminescent (EL) device and/or method that may prevent (or reduce) a phenomenon of Newton's rings and/or improve a contrast ratio by having a caved surface (or bent surface) with a predetermined depth formed in a cap.

Embodiments of the present invention may provide an organic electroluminescent (EL) device and/or method that may prevent or minimize light loss and reduce power consumption by having a caved surface with a predetermined refractive index formed in a cap.

Embodiments of the present invention may provide an organic electroluminescent (EL) device that includes a substrate including a first electrode, an organic layer and a second electrode arranged in a light-emitting region. The device may also include a cap for sealing the light-emitting region of the substrate. The cap may have a caved surface with a minimum depth of 10 μm from a surface of the cap and a maximum depth of 10% of a total thickness of the cap.

The minimum distance between a boundary point of the caved surface in the cap and a boundary line of the light-emitting region may be approximately 70 μm.

An angle between the bottom surface of the cap and an inclined surface (or plane) of the caved surface may be approximately 60° or less.

The cap at the caved surface may have a refractive index of 1.6 to 2. The cap may be composed of transparent materials including $TiO_2$, $BaO$ and $B_2O_3$.

Embodiments of the present invention may provide a method for fabricating an organic electroluminescent (EL) device that includes preparing a substrate including a first electrode, an organic layer and a second electrode arranged in a light-emitting region, and preparing a cap for sealing the light-emitting region in the substrate. The method may also include forming a caved surface in the cap such that the caved surface has a minimum depth of 10 μm from a surface of the cap, and such that the caved surface have a maximum depth of 10% of a total thickness of the cap. The method may also include adhering the cap to the substrate such that the cap seals the light-emitting region of the substrate.

The caved surface may be formed by etching, sand blasting and/or molding.

The depth of the caved surface may be determined to allow a refractive index of the cap at the caved surface to be within a range of 1.6 to 2.

The organic electroluminescent (EL) device and a fabrication method thereof may have many advantages. For example, embodiments of the present invention may prevent Newton's rings, improve a contrast ratio and/or reduce external physical impacts by forming a caved surface in the cap. The caved surface may have a minimum depth of 10 μm from the surface of the cap. The caved surface may also have a maximum depth of 10% of the total thickness of the cap. The formation of the caved surface in the cap may enable reinforcement of stiffness of the cap and reduce exterior physical impacts.

Additionally, embodiments of the present invention may prevent light loss, improve luminescent efficiency and/or reduce power consumption by forming the caved surface in the cap such that the cap has a refractive index within a range of approximately 1.6 to 2.

Embodiments of the present invention may provide an organic electroluminescent (EL) device that is capable of preventing Newton's rings and/or increasing a contrast ratio by forming a caved surface in the center of the cap such that the caved surface has a minimum depth of 10 um from the surface of the cap and such that the caved surface has a maximum depth of 10% of the total thickness of the cap.

In accordance with the embodiments described herein, the emitting layer cause light to be emitted in various colors. In a case where the emitting layer emits red light, the emitting layer may include a host material including carbazole biphenyl (CBP) or 1,3-bis(carbazol-9-yl (mCP), and may be formed of a phosphorescence material including a dopant material including PIQIr(acac)(bis(1-phenylisoquinoline) acetylacetonate iridium), PQIr(acac)(bis(1-phenylquinoline) acetylacetonate iridium), PQIr(tris(1-phenylquinoline)iridium), or PtOEP(octaethylporphyrin platinum) or a fluorescence material including PBD:Eu(DBM)3(Phen) or Perylene.

In the case where the emitting layer emits red light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.0 to 6.0, and a lowest unoccupied molecular orbital of the dopant material may range from 2.4 to 3.5.

In the case where the emitting layer emits green light, the emitting layer includes a host material including CBP or mCP, and may be formed of a phosphorescence material including a dopant material including Ir(ppy)3(fac tris(2-phenylpyridine)iridium) or a fluorescence material including Alq3 (tris(8-hydroxyquinolino)aluminum).

In the case where the emitting layer emits green light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.5 to 6.0, and a lowest unoccupied molecular orbital of the dopant material may range from 2.0 to 3.5.

In the case where the emitting layer emits blue light, the emitting layer includes a host material including CBP or mCP, and may be formed of a phosphorescence material including a dopant material including (4,6-F2 ppy)2Irpic or a fluorescence material including spiro-DPVBi, spiro-6P, distyryl-benzene (DSB), distyryl-arylene (DSA), PFO-based polymers, PPV-based polymers, or a combination thereof.

In the case where the emitting layer emits blue light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.5 to 6.0, and a lowest unoccupied molecular orbital of the dopant material may range from 2.0 to 3.5.

A difference between driving voltages, e.g., the power voltages VDD and Vss of the organic light emitting device may change depending on the size of the display panel 100 and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
| --- | --- | --- | --- |
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
|---|---|
| S < 3 inches | 4~20 (V) |
| 3 inches < S < 20 inches | 5~25 (V) |
| 20 inches < S | 5~30 (V) |

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic electroluminescent (EL) device comprising:
   a substrate;
   a first electrode, an organic layer and a second electrode provided on the substrate to form a light-emitting region; and
   a cap to seal the light-emitting region, the cap having a caved surface between a first boundary point and a second boundary point, a top surface that faces away from the substrate and a bottom surface that faces the substrate, the cap having a thickness in a first direction between the top surface and the bottom surface, the bottom surface defining a second plane in a second direction, the caved surface including a top point that is a furthest point on the caved surface from the substrate,
   wherein the cap has the caved surface that satisfies a first condition, a second condition, and a third condition,
   wherein the first condition is that the caved surface has a depth in a range of 10 μm-10% of a total thickness of the cap, wherein the depth is a distance in the first direction from the second plane to the top point, and the total thickness of the cap is the thickness in the first direction between the top surface and the bottom surface,
   the second condition is that a distance in the second direction between the first boundary point of the caved surface and a boundary line of the light-emitting region is 70 μm-4 mm, and
   the third condition is that an angle between the bottom surface of the cap at the first boundary point and an inclined surface of the caved surface at the first boundary point is 1°-60°.

2. The organic electroluminescent (EL) device according to claim 1, wherein a total surface area of the caved surface is greater than a total surface area of the light-emitting region.

3. The organic electroluminescent (EL) device according to claim 1, wherein a refractive index of the cap at the caved surface is 1.6 to 2.

4. The organic electroluminescent (EL) device according to claim 1, wherein the cap is composed of transparent materials including $TiO_2$, $BaO$ and $B_2O_3$.

5. The organic electroluminescent (EL) device according to claim 4, wherein the composition ratio (mole/mole/mole %) of $TiO_2$:$BaO$:$B_2O_3$ is approximately 10%-60%:approximately 10%-40%:approximately 5%-30%.

6. The organic electroluminescent (EL) device according to claim 1, further comprising:
   a sealing material to adhere the cap to the substrate.

7. The organic electroluminescent (EL) device according to claim 6, wherein the sealing material comprises a UV curable material, a thermally curable material or a glass frit.

8. An organic electroluminescent (EL) device comprising:
   a substrate;
   a first electrode, an organic layer and a second electrode to form a light-emitting region on the substrate; and
   a cap to cover the light-emitting region, the cap having a caved surface between a first boundary point and a second boundary point, a top surface that faces away from the substrate and a bottom surface that faces the substrate, the cap having a thickness in a first direction between the top surface and the bottom surface, the bottom surface defining a second plane in a second direction, the caved surface including a top point that is a furthest point on the caved surface from the substrate,
   wherein the cap has the caved surface that satisfies a first condition, a second condition, and a third condition,
   wherein the first condition is that the caved surface has a depth in a range of 10 μm 10% of a total thickness of the cap, wherein the depth is a distance in the first direction from the second plane to the top point, and the total thickness of the cap is the thickness in a first direction between the top surface and the bottom surface,
   the second condition is that a distance in the second direction between the first boundary point of the caved surface and a boundary line of the light-emitting region is 70 μm-4 mm, and
   the third condition is that a refractive index of the cap at the caved surface is 1.6 to 2.

9. The organic electroluminescent (EL) device according to claim 8, wherein an angle between the bottom surface of the cap at the first boundary point and an inclined surface of the caved surface at the first boundary point is 60° or less.

10. An organic electroluminescent (EL) device comprising:
    a substrate;
    a first electrode, an organic layer and a second electrode provided on the substrate to form a light-emitting region, the light emitting region including a plurality of subpixels; and
    a cap to seal the light-emitting region, the cap having a caved surface between a first boundary point and a second boundary point, a top surface that faces away from the substrate and a bottom surface that faces the substrate, the cap having a thickness in a first direction between the top surface and the bottom surface, the bottom surface defining a second plane in a second direction, the caved surface including a top point that is a furthest point on the caved surface from the substrate,
    wherein the cap has the caved surface that satisfies a first condition, a second condition, and a third condition,
    wherein the first condition is that the caved surface has a depth in a range of 10 μm-10% of a total thickness of the cap, wherein the depth is a distance in the first direction from the second plane to the top point, and the total thickness of the cap is the thickness in a first direction between the top surface and the bottom surface, the second condition is that a distance in the second direction between the first boundary point of the caved surface and a boundary line of the light-emitting region is 70 μm-4 mm, and the third condition is that an angle between the bottom surface of the cap at the first boundary point and an inclined surface of the caved surface at the first boundary point is 1°-60°;

wherein at least one of the plurality of subpixels includes a phosphorescence material.

11. The organic electroluminescent (EL) device according to claim 10, wherein a total surface area of the caved surface is greater than a total surface area of the light-emitting region.

12. The organic electroluminescent (EL) device according to claim 10, wherein a refractive index of the cap at the caved surface is 1.6 to 2.

13. The organic electroluminescent (EL) device according to claim 10, further comprising:
a sealing material to adhere the cap to the substrate.

14. An organic electroluminescent (EL) device comprising:
a substrate;
a first electrode, an organic layer and a second electrode provided on the substrate to form a light-emitting region; and
a cap to seal the light-emitting region, the cap having a caved surface between a first boundary point and a second boundary point, a top surface that faces away from the substrate and a bottom surface that faces the substrate, the cap having a thickness in a first direction between the top surface and the bottom surface, the bottom surface defining a second plane in a second direction, the caved surface including a top point that is a furthest point on the caved surface from the substrate, wherein the cap has the caved surface that satisfies a first condition, a second condition, a third condition and a fourth condition, wherein the first condition is that the caved surface has a depth in a range of 10 μm-10% of a total thickness of the cap, wherein the depth is a distance in the first direction from the second plane to the top point, and the total thickness of the cap is the thickness in a first direction between the top surface and the bottom surface, the second condition is that a distance in the second direction between the first boundary point of the caved surface and a boundary line of the light-emitting region is 70 μm-4 mm, and the third condition is that an angle between the bottom surface of the cap at the first boundary point and an inclined surface of the caved surface at the first boundary point is 1°-60°, the fourth condition is that a refractive index of the cap at the caved surface is 1.6 to 2.

15. The organic electroluminescent (EL) device according to claim 14, wherein a total surface area of the caved surface is greater than a total surface area of the light-emitting region.

16. The organic electroluminescent (EL) device according to claim 14, further comprising:
a sealing material to adhere the cap to the substrate.

* * * * *